US009069018B2

(12) United States Patent
Alex et al.

(10) Patent No.: US 9,069,018 B2
(45) Date of Patent: Jun. 30, 2015

(54) OVERHEAD POWER LINE MONITOR

(75) Inventors: Paul Alan Alex, Fairfield, CT (US);
Duncan Breese, New Milford, CT (US);
Larry Fish, White Plains, NY (US);
Charles Lipsky, Cortlandt Manor, NY (US); Chunchuan Xu, Hartsdale, NY (US)

(73) Assignee: UNDERGROUND SYSTEMS, INC., Armonk, NY (US)

( * ) Notice: Subject to any disclaimer, the term of this patent is extended or adjusted under 35 U.S.C. 154(b) by 655 days.

(21) Appl. No.: 13/266,618

(22) PCT Filed: Apr. 29, 2010

(86) PCT No.: PCT/US2010/033009
§ 371 (c)(1),
(2), (4) Date: Oct. 27, 2011

(87) PCT Pub. No.: WO2010/127145
PCT Pub. Date: Nov. 4, 2010

(65) Prior Publication Data
US 2012/0046799 A1   Feb. 23, 2012

Related U.S. Application Data

(60) Provisional application No. 61/174,228, filed on Apr. 30, 2009.

(51) Int. Cl.
*G05D 11/00* (2006.01)
*G01R 15/14* (2006.01)
*G01R 19/25* (2006.01)
*G01R 31/08* (2006.01)

(52) U.S. Cl.
CPC .......... *G01R 15/142* (2013.01); *G01R 19/2513* (2013.01); *G01R 31/085* (2013.01)

(58) Field of Classification Search
CPC ............................ G01R 19/2513; G01R 15/14
USPC ......... 700/298; 702/57, 64, 65; 324/127, 142, 324/512
See application file for complete search history.

(56) References Cited

U.S. PATENT DOCUMENTS

| | | | |
|---|---|---|---|
| 4,799,005 A | * | 1/1989 | Fernandes ..................... 324/127 |
| 5,181,026 A | | 1/1993 | Granville |
| 5,508,606 A | | 4/1996 | Ryczek |

(Continued)

FOREIGN PATENT DOCUMENTS

| | | | |
|---|---|---|---|
| WO | WO2006/050156 | * | 5/2006 |
| WO | WO 2007/134022 | | 11/2007 |

*Primary Examiner* — Kenneth Lo
*Assistant Examiner* — Chad Rapp
(74) *Attorney, Agent, or Firm* — Frommer Lawrence & Haug LLP; William S. Frommer; Paul A. Levy

(57) ABSTRACT

A device for monitoring and measuring the electrical and mechanical parameters of a power line conductor. Sensors of the device measure conductor temperature, the angle of inclination of the overhead conductor, current flowing in the conductor, and voltage to ground. The device has a low-power mode in which parameters of the power line conductor are not measured. Upon detecting a change in an electrical or mechanical value of the power line conductor, the device measures parameters of the power line conductor for a predetermined length of time before returning to the low power mode.

8 Claims, 9 Drawing Sheets

(56) References Cited

U.S. PATENT DOCUMENTS

| | | | |
|---|---|---|---|
| 6,205,867 B1* | 3/2001 | Hayes et al. | 73/862.391 |
| 7,336,019 B1 | 2/2008 | Puskas | |
| 2005/0040809 A1 | 2/2005 | Uber, III et al. | |
| 2006/0025897 A1 | 2/2006 | Shostak et al. | |
| 2008/0122642 A1* | 5/2008 | Radtke et al. | 340/660 |
| 2008/0297162 A1* | 12/2008 | Bright et al. | 324/512 |

* cited by examiner

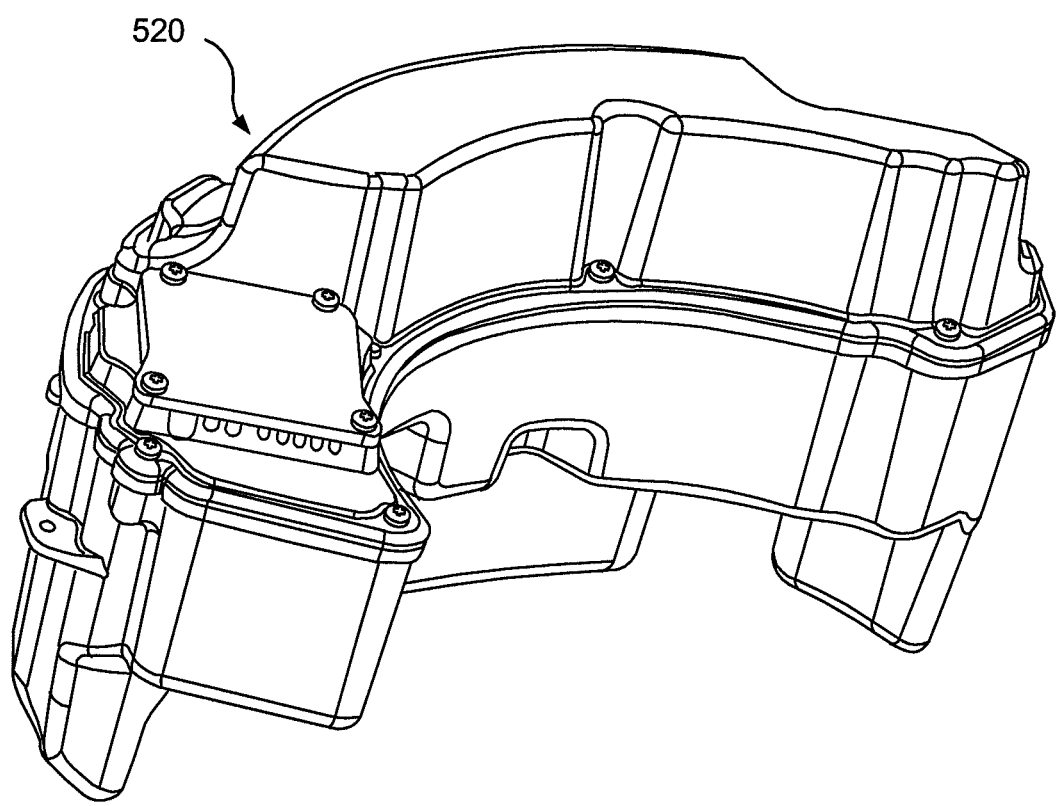
F I G. 5

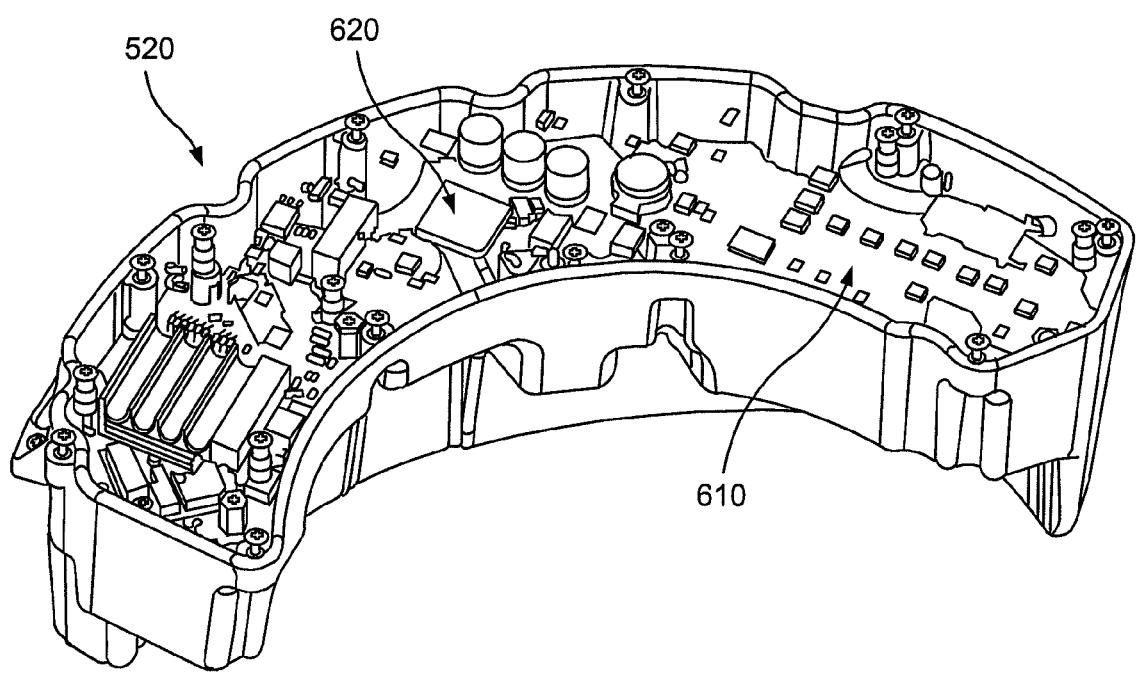
F I G. 6

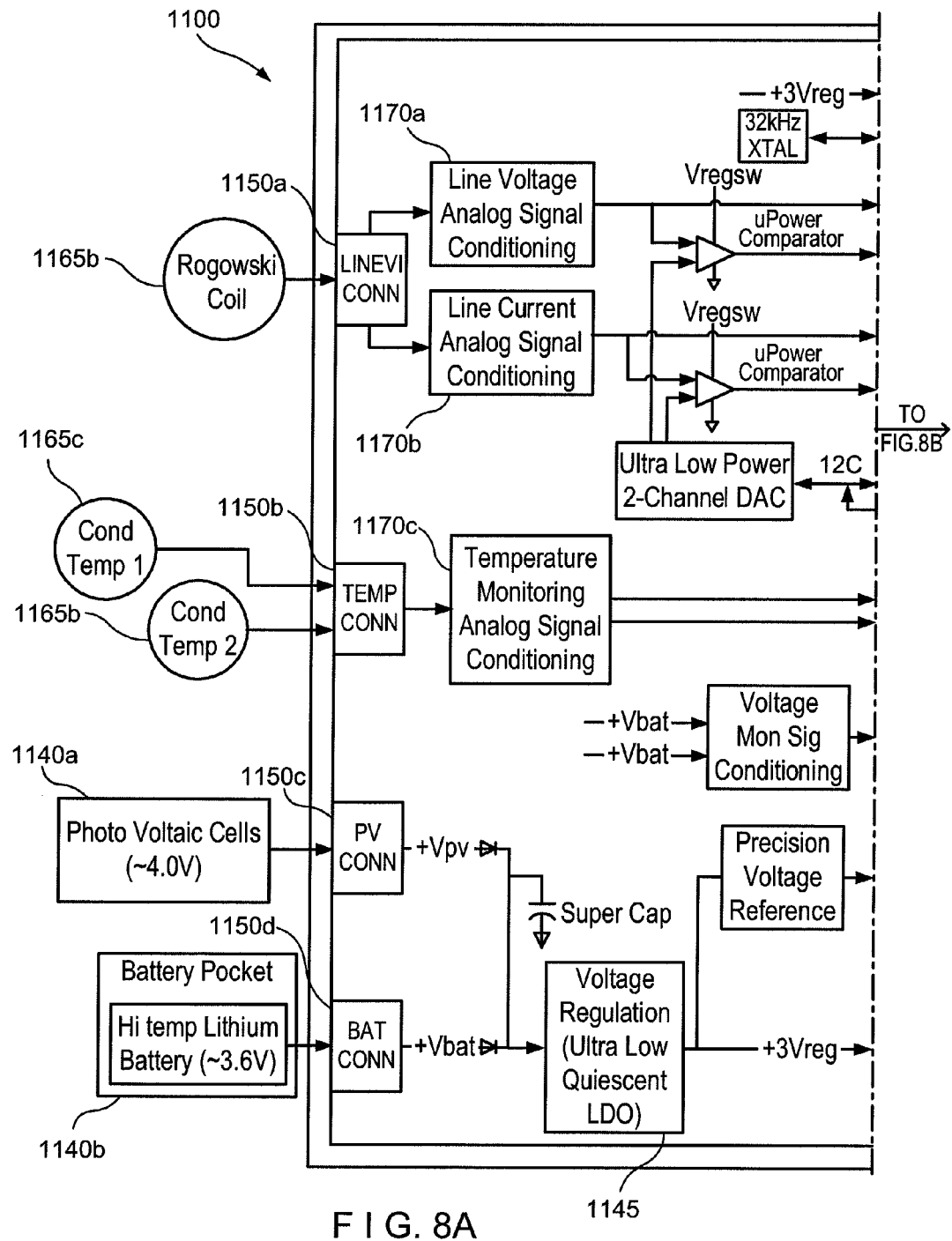
F I G. 8A

OVERHEAD POWER LINE MONITOR

This application claims the benefit of U.S. Provisional Application 61/174,228, filed Apr. 30, 2009, the entirety of which is incorporated herein by reference.

BACKGROUND

1. Field of the Invention

The present invention relates generally to an apparatus for monitoring and measuring operating parameters of power conductors. More particularly, the apparatus may be mounted onto overhead power transmission lines to monitor the electrical, thermal and mechanical operation of an AC or DC electrical power system.

2. Description of Related Art

Instruments for measuring power line parameters can be mounted on a power line. These power line monitors include sensors to sense electrical and mechanical features of the power line. Some power line monitors include a capability for analyzing the performance of particular parameters of overhead power line conductors. Typically, these instruments measure a subset of the many parameters needed to completely analyze an electrical power system.

Power lines can be dangerous to persons and are usually elevated a safe distance above the ground where the lines are out of easy reach. Because the power line monitors are often located on overhead power lines, the sensed parameters can be difficult to retrieve. Typically, the sensed parameters and analyses from each power line monitor are transmitted wirelessly to a respective ground station. That is, individual instruments gather data for transmission through local ground receiving stations which in turn retransmit the raw and also the analyzed data to central control stations for further correlation and analysis.

It can be difficult to provide services—for example power and data communications—to power line monitors because of the inconvenient location of the monitors on overhead power lines. In particular, power for electrical components in the monitor needs to be provided. Typically, some power line monitors draw power from the electrical field surrounding an energized power line to provide power for the electrical components. In this case, the current in the power line causes a magnetic field to set up around the power line. The field induces a current in a coil inside the monitor, which is then used to power the electrical components.

SUMMARY

Disclosed is an apparatus and method for monitoring the operation of an electric power line conductor. The apparatus includes one or more sensors to measure respective parameters associated with the power line conductor. A level sensor is provided to detect a change in one or more parameters of the power line conductor and in response cause the apparatus to switch from a first operating mode to a second operating mode. The power source of the apparatus is independent of the power line conductor. The one or more sensors measure respective parameters associated with the power line conductor for a predetermined length of time when the apparatus is in the second operating mode, and the one or more sensors do not measure the respective parameter during the first operating mode.

BRIEF DESCRIPTION OF THE DRAWINGS

FIG. 5 is an external view of an embodiment of the electronics assembly;

FIG. 6 is an internal view of an embodiment of the electronics assembly;

DETAILED DESCRIPTION

Figure 1:
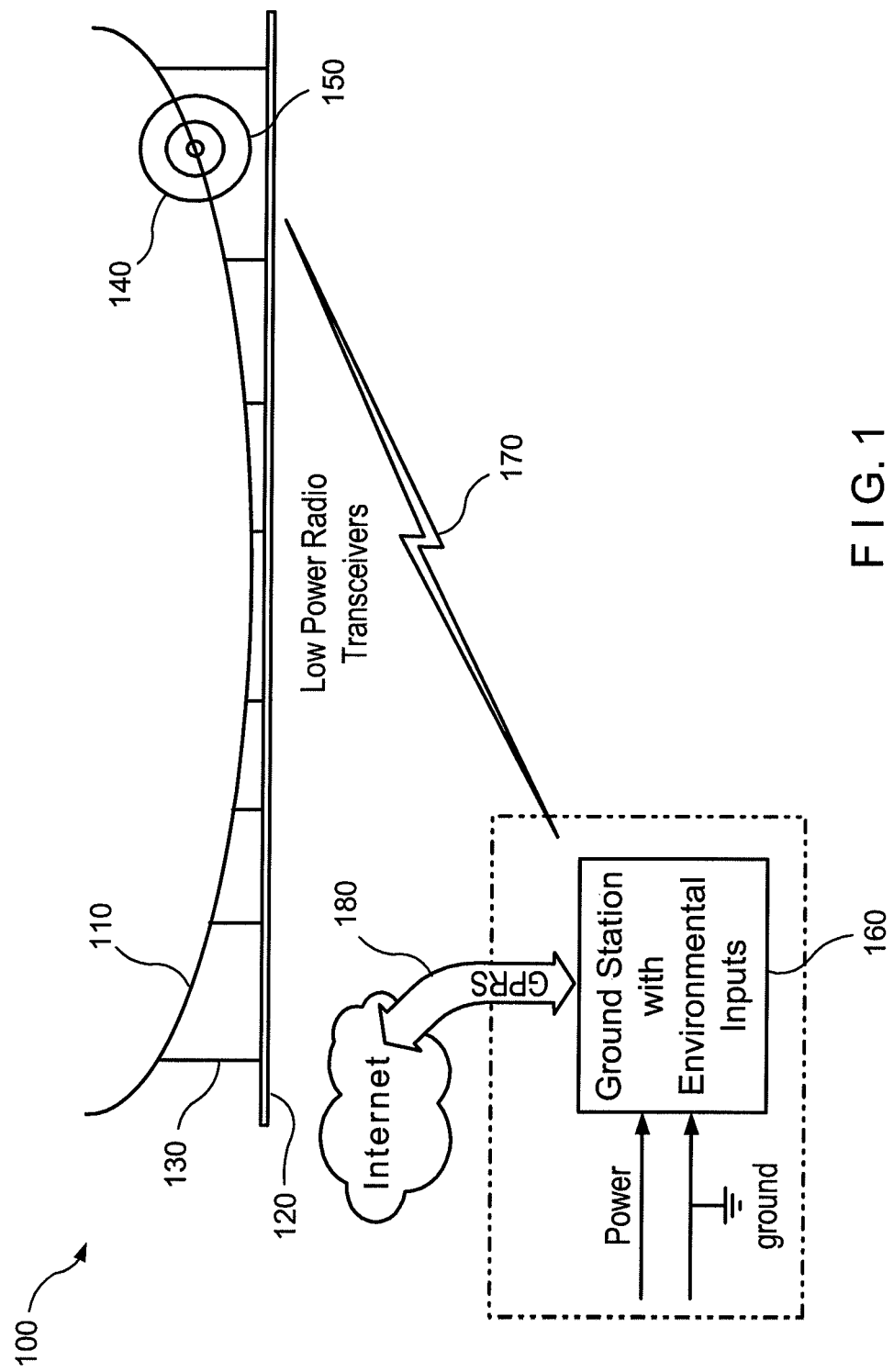
FIG. 1 is an apparatus of the present invention mounted on a catenary power line conductor.

FIG. 1 illustrates a particular application of an overhead power line system 100 used with a power line conductor 110 that may be of the type, for example, to power electric trains, trams, or other vehicles. The power line monitor of the present invention is used to sense or measure parameters of power line conductors that provide power to the vehicle. The power line monitor can be used to monitor parameters on the power line, such as the current, temperature, voltage, inclination, and vibration for an electrically powered train system. In this application the power line monitor is mounted on the conductor 110, shown as a catenary wire, and includes the ability to accept an external temperature input from a temperature measuring device 150 with which to monitor the temperature of a trolley wire 120. An electric train makes electrical contact with the trolley wire, which provides power from the overhead power line conductor to provide electrical power to operate the vehicle.

The electric train draws current supplied by a feed station (not shown) to power line conductors 110 and 120 in the overhead power line system. An active power line conductor is a conductor carrying current. A current collector on the train such as a pantograph, bow collector, or trolley pole, or other device can be used to press against the trolley wire or contact wire 120 of the overhead power line system 100. The current collector is electrically conductive, and allows current to flow through the collector to the train motor and other electrical devices of the train, and back to the feeder station through, for example, the steel wheels of the train and one or both running rails of the track.

Trolley wire 120 is supported from above by the power line conductor 110, also referred to herein as "catenary wire," "power line conductor," "messenger wire," "power line," "transmission line," and "conductor." The catenary wire follows the natural path of a wire strung between two points that form a catenary curve. The catenary wire 110 is attached to the trolley wire 120 at regular intervals by drop wires 130. The catenary wire itself is supported regularly by mechanical structures (not shown) such as towers creating a number of catenary wire segments. The segment of catenary wire between the catenary wire supports is provided with power when the electric train enters the particular catenary wire segment.

A power line monitor 140, described further below, is positioned on the catenary wire 110. Temperature measuring device 150 such as a resistance temperature detector (RTD) can be used to monitor the temperature of the catenary wire 110 and of the trolley wire 120. The power line monitor includes sensors for sensing electrical and mechanical parameters associated with the catenary wire. The sensors can include devices for measuring conductor voltage, conductor current, conductor temperature, conductor vibration, and conductor inclination.

The power line monitor includes a level sensor to sense a change in one or more mechanical and electrical parameters of the power line conductor. The level sensor can sense a parameter that crosses a predetermined threshold value or a parameter that has changed a predetermined amount from a previous value. In response, the level sensor provides a signal to change an operating mode of the power line monitor. For example, the level sensor provides a signal when the current in the conductor reaches a predetermined threshold. In a particular embodiment, the level sensor provides a signal when a signal from the current sensor indicates a rise in conductor current above a preset ampere level. In one implementation, the rise in conductor current to produce a signal is in the range of up to 10 amperes, for example 0.1 amperes. Alternatively, the level sensor can compare signals from a sag sensor, vibration sensor or temperature sensor to a predetermined threshold and provide an output when the signal reaches the threshold. In one implementation, an increase in inclination of the conductor of 0.1 degree or greater, for example 0.5 degree, causes the monitor to switch to the active mode. In another implementation, a rise in temperature of 0.1 deg. C. or greater, for example 5 deg. C., causes the monitor to switch to the active mode. Examples of suitable level sensors are provided below.

In another embodiment, the level sensor provides a signal when a "galloping" condition of the conductor is detected. A "galloping" condition is defined as a low frequency vibration of the conductor in the range of about 0.1 Hz to 1 Hz for a predetermined length of time, for example 0.1 second or greater, five minutes or greater, or several cycles or greater. Alternatively, or in addition, the level sensor provides a signal when Aeolian vibration is detected. Aeolian vibration is vibration of the power line conductor of about 1 Hz to 150 Hz for a few cycles.

An external ground station or repeater station 160 can be employed as a companion to the overhead conductor mounted power line monitor 140. The ground station can be used to implement a bi-directional telemetry channel 170 communicating with one or more overhead conductor monitoring devices. The ground station acquires data related to power line operational parameters such as: the ambient temperature and the intensity of solar radiation that can affect the temperatures of the conductors, which are measured by the power line monitors. The ground station can also be used to store data collected from the monitors and forward the stored data to a remote computer by means of a secondary communications channel 180. The secondary communications channel includes a GSM/GPRS wireless data service, a "plain old telephone system" land line, Internet or other wireless connections. The ground station can be powered by any one or combinations of batteries, photo-voltaic, and AC or DC power supply.

A power source for the power line monitor preferably is independent of the power line conductor. An on-board, self contained power source can utilize and integrate: battery power, photovoltaic power and super/ultra capacitors in order to provide long term power for the monitor. That is, in one implementation, the power source does not draw power from the power line conductor. The power line monitor includes wireless communications technology to telemeter data to user equipment, ground station 160 or other power line mounted apparatuses.

The power line monitor preferably has two operating modes described in more detail herein below. In a first operating ("standby") mode the power line monitor does not take measurements on the power line conductor. In a second operating ("active") mode the power line monitor takes measurements on the power line conductor for a predetermined length of time. The measurements taken can be stored in the power line monitor and telemetered to user equipment, ground station 160 or other power line mounted apparatuses. The power line monitor may switch between the first and second operating modes based upon the signal from a level sensor. That is, when the level sensor detects one or more pre-selected level changes of the power line conductor parameters, the power line monitor is switched from the standby mode to the active mode.

Figure 2:
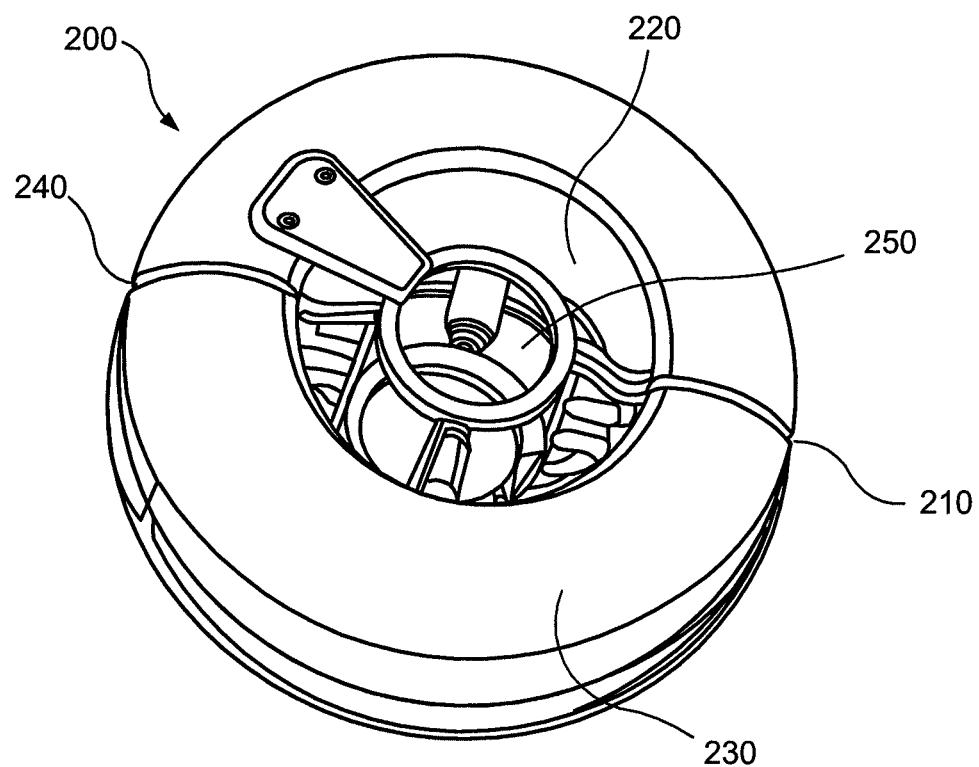
FIG. 2 is an outside view of an apparatus of the present invention.

FIG. 2 illustrates an implementation of a power line monitor 200. The power line monitor can be a "donut-shaped" device that can be releasably attached around a power line conductor whether or not the conductor is carrying current. Sensors and electronics of the monitor are disposed in a housing or shell 230. In an implementation, the monitor is split to allow for disposition about the power line conductor. The housing rotates about a hinge 210 opening a split 240 in the housing. The power line conductor passes through an opening 250 in the donut-shaped monitor. Other enclosures for the power line monitor are contemplated for mounting about an active power line.

A battery switch 220 may be accessible on the shell. Battery switch 220 can be a momentary contact push button switch. When actuated, switch 220 disables the battery from supplying power to the system, thereby minimizing depletion of internal batteries when, for example, the monitor is removed from the power line conductor.

One advantage of having the power source of the power line monitor independent of the power line conductor is that a line powered device requires a minimum threshold of current flow in the monitored conductor in order to operate. Moreover this line current must be an AC current. That is, there may be times when the power line conductor is not carrying enough current to energize the monitor. There are other times when the conductor may have DC current.

As another advantage, the independent power source of the power line monitor does not need a magnetic core to derive power from the monitored power line. For bundled conductors, catenary suspended conductors, and other complex geometries, when a magnetic core is used in the monitor to convert the field associated with current flow in the conductor into operating power for the device, this magnetic core acts as a filter choke and causes the impedance of the section of conductor onto which the device is mounted to increase relative to other segments in the conductor assembly. The alteration of impedance of the power line conductor may reduce or otherwise affect the current flow through a section of the conductor and therefore the power line monitor itself. In a conductor bundle the magnetic core has an effect to reduce the current in one conductor relative to the other conductors in the bundle.

In another application, the power line monitor can be used on direct current (DC) power line conductors because the monitor does not need to draw power from the conductor.

The power line monitor can utilize a wireless mesh network for data telemetry. An advantage of telemetering data from one power line monitor to other power line mounted apparatuses is to transmit the sensed data "daisy-chain" fashion to a central location and lessen the number of ground stations used to collect data from the power line monitors.

The power line monitor of the present invention can also be used for monitoring distributed generation systems such as wind-powered generators where the current flow in the system can be from either direction—to the wind generator or from the wind generator. The current may be low at times, such that there is insufficient current flow from which to draw power from the conductor to otherwise energize the power line monitor.

Voltage Monitoring

The power line monitor can include a voltage sensor to measure the conductor line voltage using, for example, the principal of capacitive current leakage between the monitor and ground. The input voltage can be automatically determined from 1 kV to 1100 kV or more based upon the measured leakage current.

In addition to the conductor voltage, the voltage waveforms can determined from the capacitive leakage current signal of the power line conductor. In one embodiment, the waveforms are sampled at the rate of at least 10 samples per second, for example 600 samples per second, and the RMS voltage measured from the capacitive leakage current flow once per second. The samples can be stored in the power line monitor and used to detect and to analyze power line conductor changes.

Current Monitoring

The power line monitor can include a current sensor, such as a Rogowski Coil, to measure current flow in the power line conductor. The output of a Rogowski current sense coil is a voltage proportional to the input current. In one embodiment, the power line monitor samples the voltage waveform (as derived from the current sense coil) at the rate of at least 10 samples per second, for example 600 samples per second. A microcontroller performs one RMS calculation per second on the sampled waveforms. The samples may be stored in the power line monitor and used to detect and to analyze disturbances. In one embodiment, the current sensor detects current from 0 to 3000 amperes with an accuracy of 0.2% of reading at room temperature. In another embodiment, the current sensor detects current from 0 to 300 amperes with an accuracy of 0.2% of reading at room temperature.

Temperature Monitoring

Figure 3:
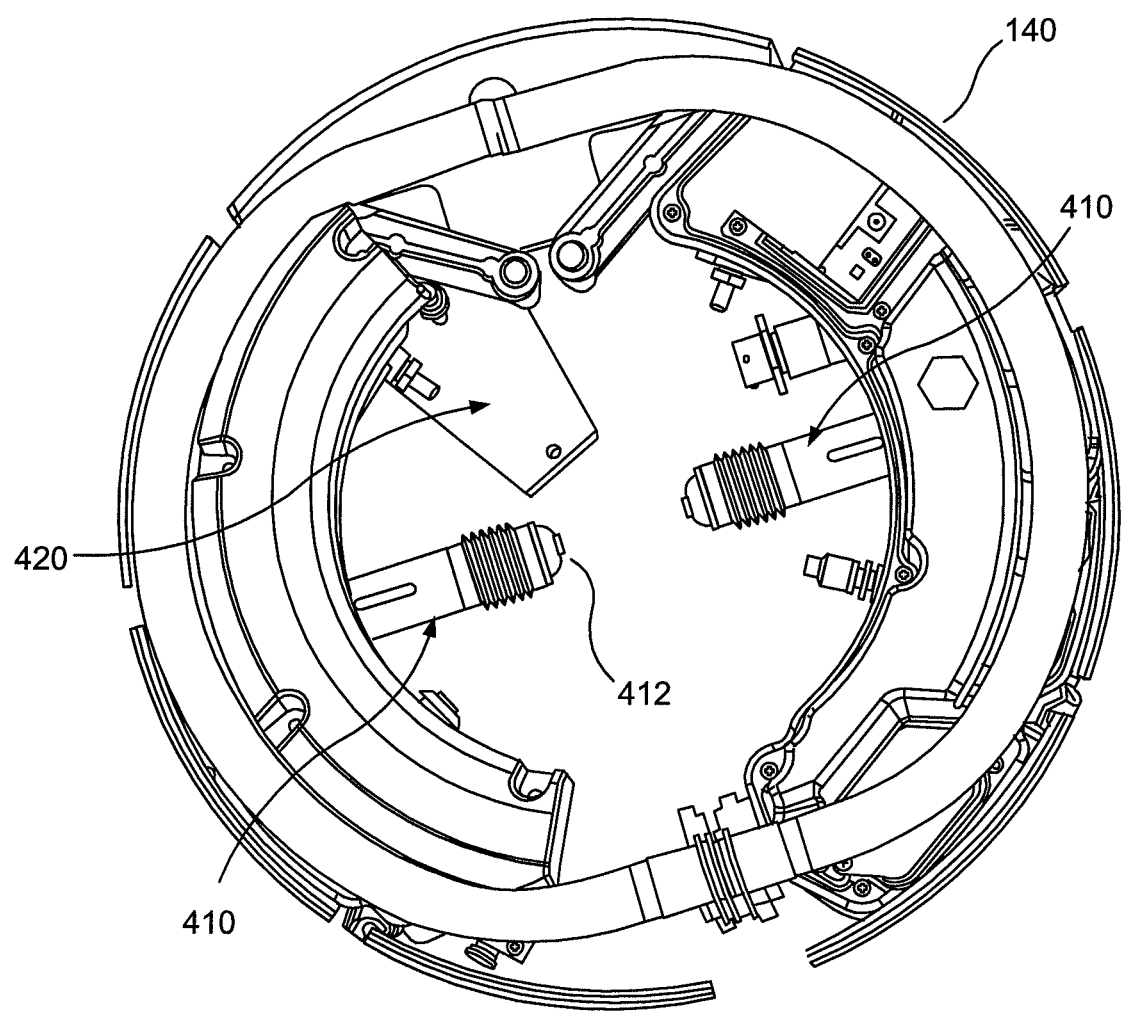
FIG. 3 is a partial cutaway view of an apparatus of the present invention.

The power line monitor can measure conductor temperature by means of, for example, a resistance temperature sensor (RTD) probe, such as AEMC's Model 6250 Micro-Ohmmeter, or an Omega OMEGA platinum pt100 RTD temperature probe sensors FIG. 3 illustrates a partial cutaway view of a power line monitor 140. Two temperature sensing probes 410 can be fitted to the monitor 140. An end 412 of each temperature probe is in contact with the power line conductor when the monitor is mounted thereon. Temperature probes 410 should be electrically and thermally isolated from the power monitor shell. In this embodiment the temperature probes measure the conductor temperature from −50 deg. C. to +300 deg. C. and produce an output signal representative of the measured temperature. A third and fourth temperature probe 150, described above with respect to FIG. 1, is external to the power line monitor shell for monitoring the temperature of the trolley wire for an electrically powered train system.

In one embodiment, when the power line monitor is in the active mode, the output signal of the RTDs representative of the conductor temperature are sampled once per second and a running average of the last ten seconds is maintained such that at any time, the transmitted temperature is the average of the samples taken over the immediate previous ten seconds.

Inclination Monitoring

The power line monitor can include a sensor, such as an inclinometer or tilt sensor, such as a Reiker liquid capacitive inclinometer or a Spectron Instruments Spectrotilt inclinometer or the like to measure an inclination of the conductor. In one implementation, the inclinometers can measure inclination of the conductor between −13 and +13 degrees from the horizontal with an accuracy of approximately 0.02 degrees and a resolution of approximately 0.01 degrees. In the active mode, the power line monitor maintains a running average of the inclination measurements over the last thirty seconds such that at any time, the monitor transmits an inclination measurement value that is the average of the inclination measurements sensed over the immediate previous thirty seconds.

Vibration Monitoring

The power line monitor can include a sensor, such as an Analog Devices accelerometer or the like to measure the vibration of the conductor. In one implementation, the accelerometer can measure vibration of the conductor between 0.1 and 150 Hz. For example, vibration in the range of 0.1 to 1 Hz; or vibration in the range of 0.1 to 2 Hz; or vibration in the range of 1 to 150 Hz; or vibration in the range of 10 to 150 Hz is measured. In the active mode, the power line monitor transmits a vibration measurement value that is the average of the vibration measurements sensed over the immediately prior thirty seconds.

Data Communications

In one embodiment, the power line monitor has at least two communication ports suitable for simultaneous communication. A first communication port may be used to transmit to, and receive data from, a ground station, another power line monitor, or other external source. The first communication port can be, for example, a low power XBEE IEEE 802.15.4 specification radio transceiver, or the like. A second communication port may be used for field update of the power line monitor firmware/software. Access to the second communication port may be available on the outside shell of the monitor. The field update port can be a wired RS-232 communication interface that allows for direct connection to the power line monitor for manufacturing and diagnostics when the unit is removed from the power line conductor. When direct connection is made for field update port, power for the power line monitor may be provided from an external source through the second communication port.

The power line monitor is capable of communicating asynchronously when the monitor is operating on external power through an antenna 420 shown in FIG. 3 disposed on the outside of the monitor shell.

Operating Modes and Mode Switching

The power line monitor is capable of operating in a standby mode and an active mode. In standby mode the power line monitor only operates selected portions of the monitor to conserve power. For example, in standby mode the communication port is monitored for incoming signals but no transmissions are made from the monitor. Also, in standby mode, output signals of selected sensors are monitored by a level sensor to determine when the output signals from those sensors exceed a predetermined threshold. However, in standby mode, measurement values of power line conductor parameters are neither taken nor recorded. Power line parameters are taken and recorded when the power line monitor is in the active mode. The standby mode is an ultra low power mode to conserve power in a battery powered monitor. Power is conserved, in part, by reducing the leakage current to ground. For example in one embodiment, the current drain from the batteries is less than 1 microampere.

When in the standby mode, the level sensor provides an output when a conductor parameter value crosses a predetermined threshold or a conductor parameter value changes a predetermined amount from a previous value. In one embodiment, the level sensor is a comparator that compares an output signal from one or more sensors in the power line monitor to predetermined thresholds for the respective output signals. The comparator includes, for example, one or more inputs arranged to receive a respective sensor output signal from a sensor and provide an indicator signal when the sensor output signals cross a predetermined threshold. The indicator signal causes power line monitor controller to switch the power line monitor between the standby and active modes. The comparator can be used to provide an indicator signal in response to an output from an electrical or a mechanical sensor of the power line monitor.

In one implementation, the power line monitor is used to sense parameters in the catenary wire of an electrical vehicle such as a train. The current in the catenary wire increases when a train enters a catenary wire segment of the power line because the train draws power from the trolley wire and, consequently, from the catenary wire. Therefore, the presence of a train may be detected when there is a predetermined increase in current in the catenary wire.

The level sensor may compare an output signal of the current sensor to a predetermined threshold. The level sensor provides an indicator signal to cause the power line monitor to switch to the active mode when the output signal of the current sensor exceeds the threshold, indicating the presence of a train. For example, the level sensor can cause the power line monitor to switch to the active mode when the current in the power line conductor rises above a preset ampere level. The power line monitor returns to the standby mode when the current in the conductor sensed by the current sensor drops below the predetermined threshold and parametric measurements taken in the active mode as described herein have been completed.

In another implementation, the level sensor causes the power line monitor to switch to the active mode when a mechanical change is detected. For example, when the output signal from the inclination angle or sag sensor exceeds a predetermined threshold, the power line monitor can be switched to the active mode to take parametric measurements. The level sensor can be responsive to a change in output of the parametric sensor. In one implementation, the level sensor is a tilt switch that switches the power line monitor to the active mode when the conductor tilt crosses a threshold and switches the power line monitor to the standby mode when the conductor tilt returns across the threshold. In another implementation, the level sensor is a thermocouple that closes (or opens) to switch the power line monitor to the active mode when the conductor temperature crosses a threshold and to switch the power line monitor to the standby mode when the conductor temperature returns across the threshold. Other such level sensors are contemplated used either alone or in combination with comparators or other electrical circuitry.

In another implementation, the level sensor can cause a transition to the active mode when detecting an anomalous feature of the power line conductor such as a "galloping" condition. Vibration is detectable by an accelerometer, or the like, such as discrete electronic accelerometer components, inclinometers and tilt sensors, as discussed above.

Other mechanical and electrical trigger modes are also contemplated.

Operation

Standby and Active Modes:

As discussed above, the power line monitor is in the low power standby mode as long as the level sensor does not detect a parameter that has crossed a predetermined threshold. In another embodiment, the attachment of an external power supply by, for example, a field technician causes transition of the power line monitor to the active mode.

For example, when the current sensed at the current sense coil equals or exceeds the predetermined threshold, a microcontroller, described below, causes the power line monitor to switch to the active mode within a predetermined time, such as 500 milliseconds.

The power line monitor consumes a greater amount of power in the active mode than when in the standby mode. In standby mode, parameters are neither recorded nor transmitted whereas in the active mode the controller in the power line monitor causes the monitor to begin sampling conductor parameters such as current, voltage, temperature and inclination and transmitting the sampled parameters to user equipment, ground station 160 or other power line mounted apparatuses. In one embodiment, the sampled parameters are stored and subsequently transmitted.

In one implementation, in the active mode the power line monitor samples current and voltage values for ten cycles of the alternating current on the power line. RMS voltage and current are then computed by the microcontroller, an arithmetic unit, or the like. A zero-crossing detector such as a discrete operational amplifier comparator can be used to sample I-V phase angle by detecting timing differences between zero crossings of the voltage and current waveforms output from the voltage and current sensors. A four cycle sampling/calculating pattern is initiated at the beginning of the next second and this pattern is repeated for a total of ten seconds. After the first ten seconds, the ten cycle process can be repeated at thirty second intervals and continued for an additional four and a half minutes, that is, ten times.

In another implementation, in the active mode the power line monitor samples direct current and voltage values for 100 milliseconds. The current and voltage samples are used to individually compute the RMS value of the DC current, and the RMS value of the DC voltage. In this case, the current and the voltage are by definition, in phase and the I-V phase angle is therefore zero.

Temperature and inclination values can be sampled once per second. The average of the sampled values for ten seconds is then computed. After the first ten seconds, another ten-second average of sampled values is repeated at thirty second intervals and continues for an additional four and a half minutes, that is, ten times.

When the current in the current sense coil is less than a preset trigger level—whether AC, DC or some combination, the mode switching trigger level detector causes the power line monitor to transition to the standby mode.

Factory Mode:

The power line monitor may also have a Factory Mode. When external power is applied to the external field update port, the power line monitor operates in Factory Mode, which is the active mode without the active mode sampling constraints discussed above. In Factory Mode, the power line monitor is always in the active mode and the standby mode is disabled.

Temperature and inclination values from the respective sensors are sampled, for example, once per second. The average of the readings for ten seconds is then computed. After the first ten seconds, another ten-second average of sampled values is repeated at thirty second intervals. This process continues until the monitor is switched off, or the external power is removed.

System Status Mode:

The status of the power line monitor can be transmitted to, for example, ground station 160, at predetermined intervals. A watch-dog timer (not shown) in the power line monitor generates a signal at the predetermined intervals to cause the power line monitor controller to initiate the system status mode. The predetermined interval can be, for example, between 5 minutes and 480 minutes. The controller generates a system status message that includes, for example, the real-time RMS voltage, RMS current, and conductor temperatures. The status may be transmitted to another power line monitor in "daisy chain" fashion to a centralized location or directly to a ground station.

After the power line monitor has been in the standby mode for a user selectable reporting interval, for example, one hour, the controller switches the power line monitor to the active mode where particular parameters of the power line conductor are sampled for a predetermined period of time, for example, ten seconds. The sampled parameters are sent to the ground station.

In one implementation, the power line monitor receives a signal on the first communication port from the ground station, the signal specifying a temporary reporting interval that can override the user setting for a period of time, after which the reporting interval returns to the user selected interval.

Electronics Assembly

Figure 4:
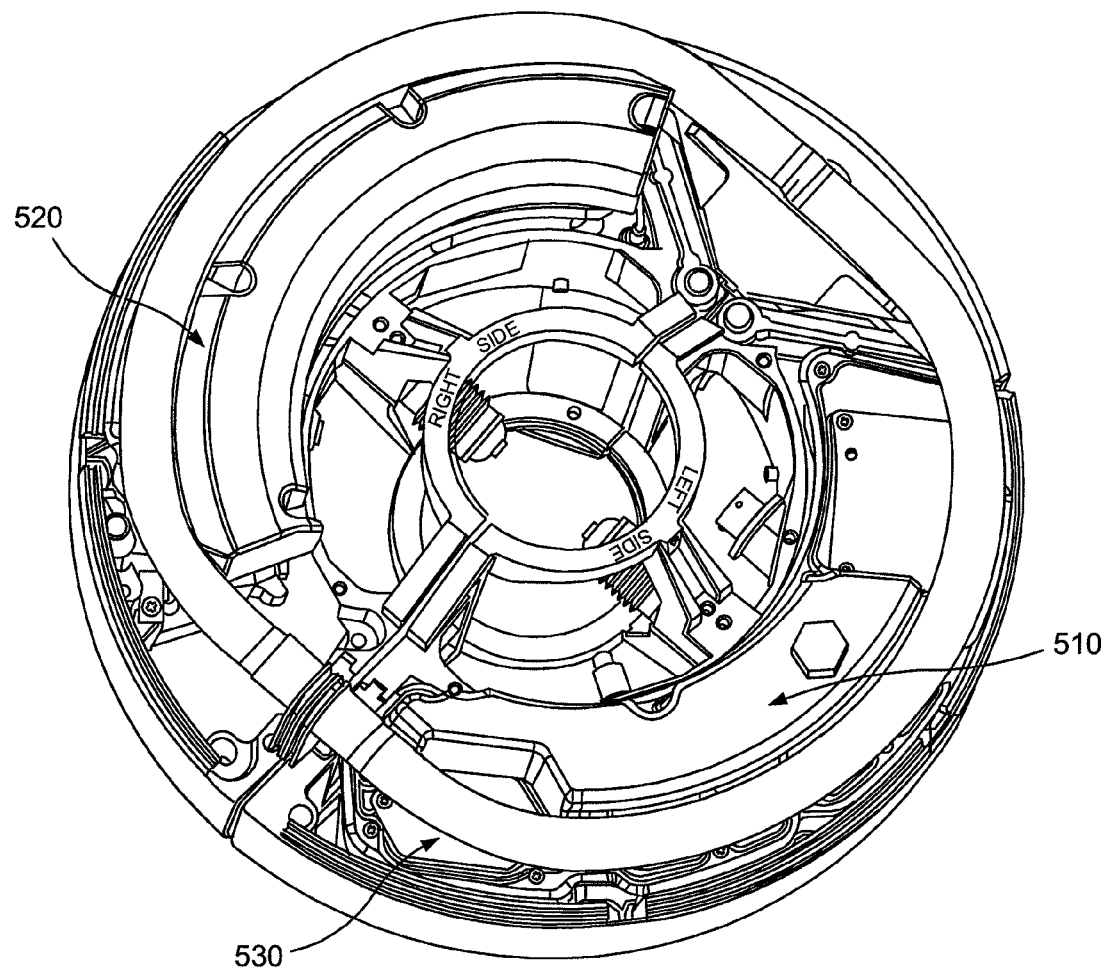
FIG. 4 is a view of the internal assemblies of an embodiment of an apparatus of the present invention.

FIG. 4 illustrates an internal view of an embodiment of the present invention. The electronics of the power line monitor are disposed in two electronics assemblies 520, 530. Assembly 520 is shown in FIG. 4. A power source 510 provides power to electrical components in assemblies 520, 530. Power source 510 (described below) is illustrated as external to the electronics assemblies. However, the power source may also be disposed within one of the assemblies.

FIG. 6 illustrates an internal view of electronics assembly 520. Electronics assembly 520 includes a main controller 610, which is a printed circuit board having electronic components mounted thereon and is described in more detail below. Main controller 610 has a microcontroller 620 mounted thereon that controls the overall functions of the power line monitor.

Figure 7:
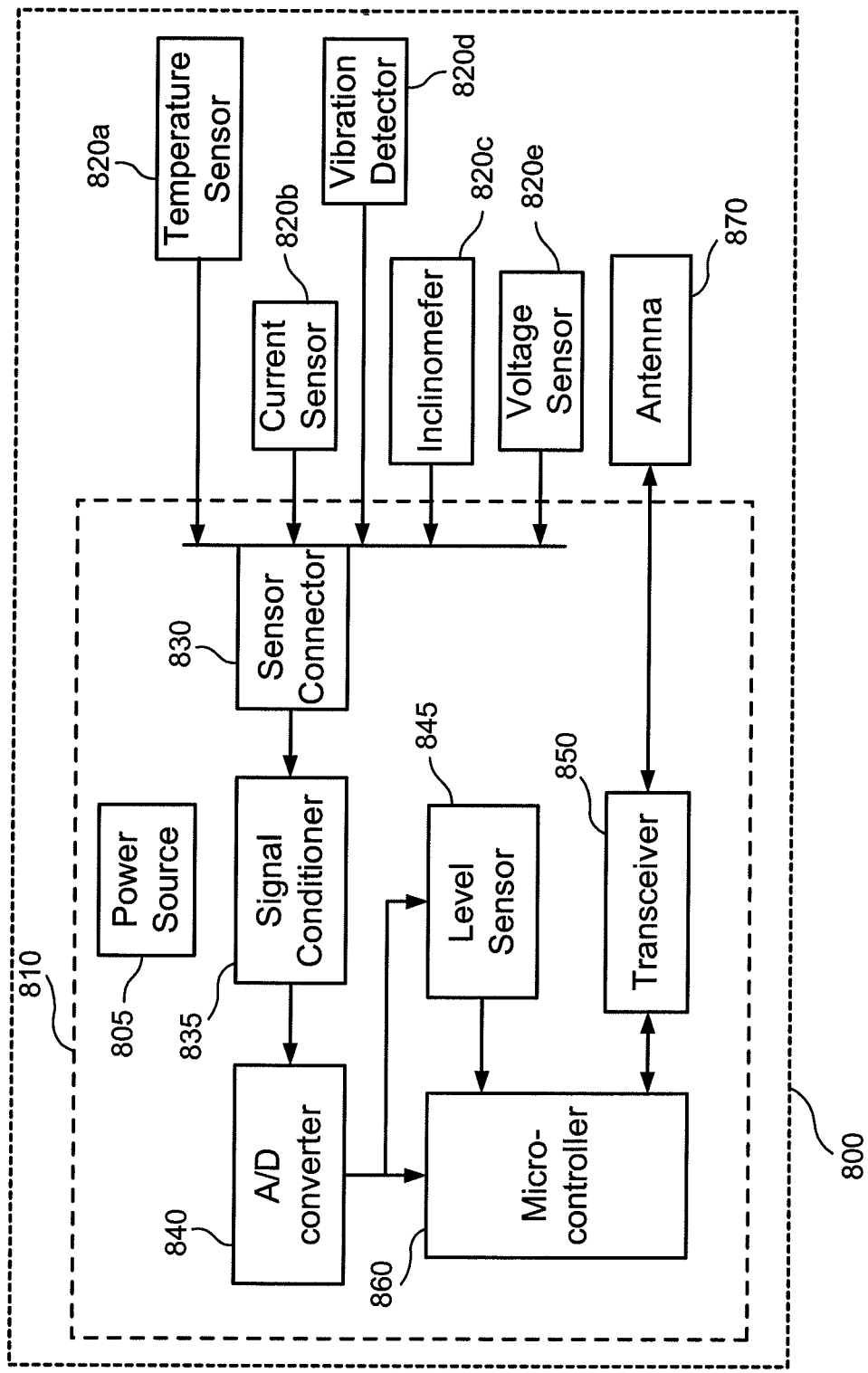
FIG. 7 is a block diagram of the electronics in an apparatus of the present invention.

FIG. 7 illustrates the architecture of one embodiment of a power line monitor 800 of the present invention. Power line monitor 800 includes a main controller 810 that controls the overall operation of the power line monitor. The power line monitor has a power source 805, a main controller 810, a communications transceiver 850 with antenna 870, and power line conductor section having sensors 820a-820e.

Power source 805 provides power for the circuitry of the monitor. Power source 805 can be batteries, ultra-capacitors, photovoltaics or other self-contained power source that is independent of the power line conductor. A photovoltaic, is a power source that converts light energy into electrical energy. Power source 805 is illustrated as part of main controller 810 but may alternatively be disposed separately from the main controller. The power source, in particular, does not draw power from the electric field surrounding an energized power line conductor.

The power line monitor includes electrical and mechanical sensors to provide signals representing parameters of the power line conductor. Examples of the electrical sensors include voltage sensing circuitry 820e, such as electric-field capacitor or capacitive leakage detector, and a current sensor such as a Rogowski coil. A zero-crossing detector (not shown), can be used to detect the zero-crossing of the voltage and current waveforms from which the microcontroller or other processor determines the difference in time of the respective zero-crossings and determines the V-I phase shift. Examples of mechanical sensors include an inclinometer 820c to provide a signal representing sag of the conductor, and a vibration detector 820d such as an accelerometer to provide a signal representing vibration of the power line conductor. A temperature sensor 820a, such as a RTD, provides a signal representing the temperature of the power line conductor. One embodiment of the configuration of an RTD to produce a temperature measurement output signal is illustrated in FIG. 3 as items 410.

Signal outputs from the electrical and mechanical sensors 820a-820e are provided to main controller 810 through one or more sensor input connectors 830. The sensor output signals are put into appropriate form for digital conversion by signal conditioner circuitry 835. The signal conditioner circuitry is used to, for example, reduce the effect of transient spikes on the sensor output signals or adjust analog voltage levels as necessary for digital conversion. The resultant conditioned signals are converted from analog to digital format by A/D converter 840 (FIG. 7) and provided to microcontroller 860 and mode switching trigger level detector 845, described in more detail below. When the power line monitor is in the standby mode, detector 845 compares one or more of the conditioned sensor outputs (e.g., the outputs from sensors 820a-820e) to predetermined threshold values for each sensor output. When one of the sensor outputs exceeds the predetermined threshold, the detector provides a signal to microcontroller 860, which, in turn, switches the power line monitor to the active mode. Alternatively, detector 845 detects when a conditional sensor output changes by a predetermined amount, such as when, for example, the temperature of the conductor rises 0.1 deg. C.

Main controller 810 includes transceiver circuitry 850 for transmitting and receiving signals to or from the power line monitor through an antenna 870. As discussed above, the power line monitor transmits power line parameters when in the active mode. Moreover, the power line monitor can receive an external signal from a ground station, for example, to cause the microcontroller to enter the active mode at scheduled time.

Figure 8B:
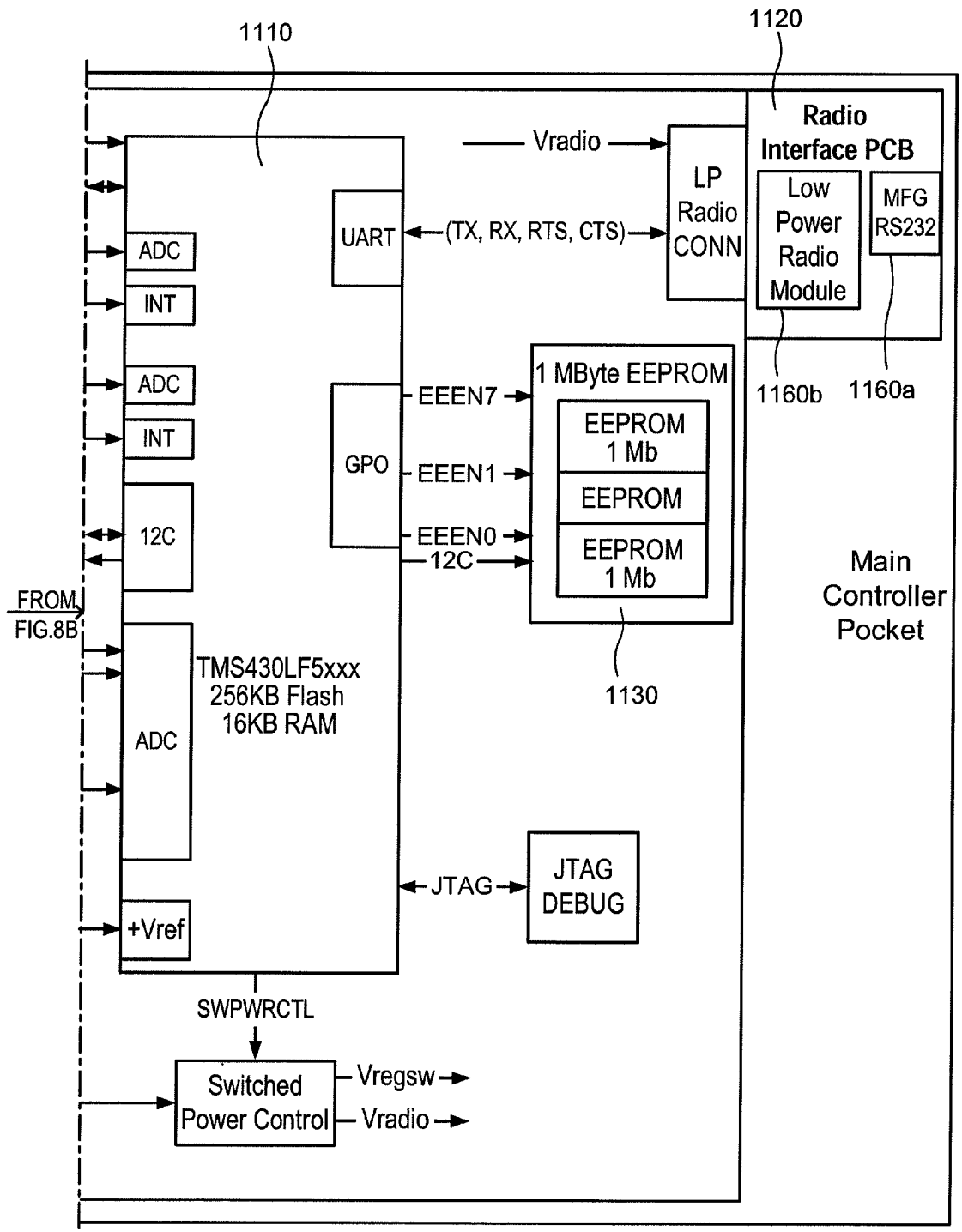
FIG. 8 is a block diagram of a main controller.

FIG. 8 illustrates a block diagram 1100 of another embodiment of the power line monitor of the present invention. The monitor includes a main controller assembly located within the monitor. The main controller contains a low power microcontroller 1110 such as a Texas Instrument MSP430LF5 or the like, radio module 1120, data memory 1130, local power supplies 1140a, 1140b and external interface connectors 1150a-1150d. Local power supplies are regulated by a voltage regulator 1145, which provides regulated voltage to the monitor electronics.

Included within the main controller assembly are two communication interfaces; these include a Field Update Port 1160a, which can be an RS232 Asynchronous Serial port, and a Short Distance Wireless radio module 1160b, which operates at a transmission/reception frequency of 2.4 GHz.

The main controller assembly includes, for example, inputs 1150a, 1150b to receive signals from sensors such as current sense coil 1165a, and from resistance temperature detectors 1165b, 1165c. Signals received are provided to signal conditioners 1170a-1170c. Coupled to the main controller assembly are an inclinometer and timing input (not shown) for current-voltage (I-V) phase timing (not shown).

The field update port ("FUP") can be a wired RS-232 communication interface that allows for direct connection of an external input to the power line monitor for manufacturing and diagnostics when the unit is removed from the power line in factory mode. The FUP includes inputs for power and communications signals and provides access to microcontroller 1110 for field and factory updates to the power line monitor software.

The main controller assembly includes long term data storage 1130 that is used for logging data and waveforms captured by the main controller. The stored data may be transmitted to the ground station, another power line monitor apparatus, or other external apparatus when a communication is made through one of the communications interfaces.

Main controller 1100 provides system level organization and sequencing of sensor output signals of the power line monitor. An output signal is received from current sense coil 1165a at external interface connector 1150a. Conditioner 1170a processes the analog signal of the current sense coil for acceptability for conversion by the analog to digital converters (ADC) of the microcontroller 1110.

Other implementations are within the scope of the following claims.

What is claimed:

1. An apparatus for monitoring the operation of an electric power line conductor having a plurality of catenary segments, comprising:
   one or more sensors to measure respective parameters associated with the power line conductor in a particular catenary segment;
   a level sensor to detect a continuous vibration of the power line conductor in excess of a predetermined threshold level and less than a predetermined frequency for a predetermined length of time in the particular catenary segment and in response cause the apparatus to switch from a quiescent operating mode to an active operating mode; and
   a power source independent of the power line conductor,
   wherein the one or more sensors measure respective parameters associated with the power line conductor in the particular catenary segment for a predetermined length of time when the apparatus is in the active operating mode, and
   wherein the one or more sensors do not measure the respective parameter when the apparatus is in the quiescent operating mode,
   wherein the apparatus further comprises a controller for generating status information of the apparatus, and the status information is transmitted to another monitoring apparatus in 'daisy chain' fashion at predetermined intervals.

2. The apparatus of claim 1, wherein the predetermined frequency is greater than 0.1 Hz and not greater than 1 Hz and the predetermined length of time is greater than 0.1 second.

3. The apparatus of claim 1, wherein the predetermined frequency is greater than 1 Hz to and not greater than 150 Hz and the predetermined length of time is greater than 0.1 second.

4. The apparatus according to claim 1, further comprising a communication device to receive an external control signal and in response cause the apparatus to operate in the active operating mode according to a predetermined schedule.

5. The apparatus according to claim 4, wherein the communication device is enabled to receive information from a first monitoring apparatus on the power line conductor and to transmit information to a second monitoring apparatus on the power line conductor.

6. The apparatus according to claim 1, wherein the power line conductor is a direct current (DC) power line conductor.

7. The apparatus according to claim 1, further comprising a housing removably attachable to an active power line conductor.

8. A method of monitoring the operation of an electric power line conductor having a plurality of catenary segments with a power line monitor, comprising:
   providing power to the power line monitor from a power source independent of the power line conductor;
   detecting a continuous vibration of the power line conductor in excess of a predetermined threshold level and less than a predetermined frequency for a predetermined length of time in the particular catenary segment;
   in response to detecting said vibration, causing the power line monitor to switch from a quiescent operating mode to an active operating mode; and
   measuring a parameter associated with the power line conductor when the power line monitor is in the active operating mode,
   wherein the power line monitor measures said parameter associated with the power line conductor in the particular catenary segment for a predetermined length of time when power line monitor is in the active operating mode, and
   generating status information of the power line monitor, and transmitting the status information to another power line monitor in 'daisy chain' fashion at predetermined intervals.

* * * * *